US008591238B2

(12) United States Patent
Zhang et al.

(10) Patent No.: US 8,591,238 B2
(45) Date of Patent: Nov. 26, 2013

(54) POWER CONNECTOR HAVING SIMPLIFIED CENTRAL CONTACT

(75) Inventors: Jun Zhang, Kunshan (CN); Chun-Sheng Li, Kunshan (CN); Jian-Jun Ma, Kunshan (CN); Bin Peng, Kunshan (CN); Jun Wang, Kunshan (CN); Le-Juan Yu, Kunshan (CN); Yan Tian, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/401,775

(22) Filed: Feb. 21, 2012

(65) Prior Publication Data

US 2013/0005191 A1 Jan. 3, 2013

(30) Foreign Application Priority Data

Jul. 1, 2011 (CN) .......................... 2011 2 0228343

(51) Int. Cl.
*H01R 12/00* (2006.01)

(52) U.S. Cl.
USPC ........................................ 439/63; 439/607.35

(58) Field of Classification Search
USPC ....................... 439/63, 581, 668, 675, 607.35
See application file for complete search history.

(56) References Cited

U.S. PATENT DOCUMENTS 4,598,961 A * 7/1986 Cohen ............................ 439/63
4,884,982 A * 12/1989 Fleming et al. .......... 439/620.03
5,007,851 A * 4/1991 Matsumoto .................. 439/188
5,062,811 A * 11/1991 Hackman ................. 439/620.03
5,326,280 A * 7/1994 Briones et al. ................ 439/581
5,413,504 A * 5/1995 Kloecker et al. ......... 439/620.03
5,601,451 A * 2/1997 Driones et al. ................ 439/490
5,662,481 A * 9/1997 Wright ............................ 439/63
5,797,768 A * 8/1998 Francaviglia ................. 439/567
5,927,999 A * 7/1999 Shimojyo ........................ 439/63
6,036,545 A * 3/2000 Caviness et al. ........... 439/620.1
6,164,977 A * 12/2000 Lester ............................. 439/63
6,322,397 B1 * 11/2001 Zhang ........................... 439/668
6,382,999 B1 * 5/2002 Mou et al. ..................... 439/188
6,386,888 B1 * 5/2002 Skopic et al. .................... 439/63
6,390,825 B1 * 5/2002 Handley et al. ................. 439/63
6,551,115 B1 * 4/2003 Li et al. ........................... 439/79
6,623,277 B1 * 9/2003 Zhu et al. ......................... 439/63
6,695,644 B2 * 2/2004 Zhao et al. ..................... 439/580
6,776,621 B1 * 8/2004 Dye ................................. 439/63
6,866,543 B2 * 3/2005 Chen et al. ..................... 439/578
6,932,614 B1 * 8/2005 Kan ............................... 439/580
6,932,616 B1 * 8/2005 Swantner et al. ............... 439/63
6,994,564 B1 * 2/2006 Kan ................................. 439/63
7,014,480 B1 * 3/2006 Weidner et al. ................. 439/95

(Continued)

FOREIGN PATENT DOCUMENTS

CN 101645561 2/2010

*Primary Examiner* — Ross Gushi
(74) *Attorney, Agent, or Firm* — Wei Te Chung; Ming Chieh Chang

(57) ABSTRACT

An electrical connector includes an insulative housing, a first contact and a central contact being of a uni-configuration respectively retained in the housing. The housing has a mating cavity extending through a front face thereof, a receiving hole extending through a rear face thereof, and a projection rearwards projecting from the rear face. The projection defines a retaining slot opened sideward and a supporting portion disposed between the retaining slot and the rear face of the housing, a connecting portion of the central contact climbs over the supporting portion and runs through the retaining slot.

20 Claims, 7 Drawing Sheets

(56) References Cited

U.S. PATENT DOCUMENTS

| | | | | |
|---|---|---|---|---|
| 7,063,573 | B2 * | 6/2006 | Chen | 439/677 |
| 7,086,867 | B2 * | 8/2006 | Nakagawa et al. | 439/63 |
| 7,097,505 | B1 * | 8/2006 | Shanahan et al. | 439/607.01 |
| 7,101,189 | B1 * | 9/2006 | Huss et al. | 439/63 |
| 7,101,230 | B2 * | 9/2006 | Ma | 439/668 |
| 7,108,514 | B2 * | 9/2006 | Chen et al. | 439/63 |
| 7,114,989 | B2 * | 10/2006 | Yin | 439/578 |
| 7,179,124 | B2 * | 2/2007 | Zhang et al. | 439/607.55 |
| 7,186,141 | B2 * | 3/2007 | Li et al. | 439/573 |
| 7,278,863 | B1 * | 10/2007 | Chen et al. | 439/79 |
| 7,318,749 | B2 * | 1/2008 | Li et al. | 439/580 |
| 7,338,329 | B2 * | 3/2008 | Yang | 439/675 |
| 7,445,515 | B1 * | 11/2008 | Yuan et al. | 439/668 |
| 7,473,110 | B1 * | 1/2009 | Wu et al. | 439/79 |
| 7,510,437 | B2 * | 3/2009 | Wu | 439/581 |
| 7,530,813 | B1 * | 5/2009 | Tsai et al. | 439/63 |
| 7,604,513 | B2 * | 10/2009 | Wang et al. | 439/668 |
| 7,621,753 | B1 * | 11/2009 | Pai | 439/63 |
| 7,651,344 | B2 * | 1/2010 | Wu | 439/80 |
| 7,708,563 | B2 * | 5/2010 | Block et al. | 439/63 |
| 7,766,662 | B2 * | 8/2010 | Akama et al. | 439/63 |
| 7,901,249 | B1 * | 3/2011 | Chen | 439/607.4 |
| 7,914,344 | B2 * | 3/2011 | Tin et al. | 439/675 |
| 7,927,108 | B2 * | 4/2011 | Gong et al. | 439/63 |
| 7,934,960 | B1 * | 5/2011 | Zhang et al. | 439/668 |
| 7,988,455 | B2 * | 8/2011 | Blakborn | 439/63 |
| 8,079,880 | B2 * | 12/2011 | Lin et al. | 439/668 |
| 8,162,672 | B2 * | 4/2012 | Huang | 439/63 |
| 8,277,248 | B2 * | 10/2012 | Blakborn | 439/581 |
| 2003/0092290 | A1 * | 5/2003 | Le Gallic et al. | 439/63 |
| 2003/0203658 | A1 * | 10/2003 | Zhao et al. | 439/63 |
| 2004/0157498 | A1 * | 8/2004 | Hall et al. | 439/680 |
| 2005/0048847 | A1 * | 3/2005 | Hsieh | 439/668 |
| 2005/0233603 | A1 * | 10/2005 | Chen et al. | 439/63 |
| 2005/0245104 | A1 * | 11/2005 | Nakagawa et al. | 439/63 |
| 2006/0141868 | A1 * | 6/2006 | Ma | 439/668 |
| 2006/0160427 | A1 * | 7/2006 | Yin | 439/668 |
| 2006/0234563 | A1 * | 10/2006 | Yang | 439/668 |
| 2006/0258212 | A1 * | 11/2006 | Li et al. | 439/580 |
| 2008/0139043 | A1 * | 6/2008 | Wang et al. | 439/573 |
| 2009/0215315 | A1 * | 8/2009 | Cheng | 439/607.28 |
| 2010/0105226 | A1 * | 4/2010 | Gong et al. | 439/135 |
| 2011/0092095 | A1 * | 4/2011 | Annequin | 439/578 |
| 2011/0111644 | A1 * | 5/2011 | Jin | 439/668 |
| 2011/0143603 | A1 * | 6/2011 | Huang et al. | 439/675 |
| 2013/0005191 | A1 * | 1/2013 | Zhang et al. | 439/660 |

* cited by examiner

POWER CONNECTOR HAVING SIMPLIFIED CENTRAL CONTACT

FIELD OF THE INVENTION

The present invention relates generally to a power connector, and more particularly to a power connector with simplified central contact benefiting convenient assemblage.

DESCRIPTION OF THE RELATED ART

Chinese Patent Publication No. 101645561 submitted by Cheng on Aug. 4, 2008 discloses an electrical connector including an insulative housing having a mating face, and a central contact retained in the housing. The housing defines a mating cavity recesses rearwards from the mating face for receiving a mating plug, and a hollow chamber communicating with the mating cavity and running through a rear wall of the housing. The hollow chamber provides a retaining slot in the rear wall. The central contact defines a columnar mating portion, a columnar soldering portion and a rectangular retaining portion connecting the mating portion and the soldering portion. The rectangular retaining portion is received in the hollow chamber and can be rotated to be restricted in the retaining slot for retaining the central contact in the housing reliably. However, the central contact has a rectangular retaining portion but columnar mating portion and soldering portion, which makes the configuration of the central contact having different contour complex.

Hence, an electrical connector having a central contact which has simple configuration and convenient assemblage is desired to overcome the aforementioned disadvantage of the prior art.

SUMMARY OF THE INVENTION

Accordingly, an object of the present invention is to provide an electrical connector having a simplified central contact which has convenient assemblage.

In order to achieve the object set forth, an electrical connector includes an insulative housing, a first contact and a central contact respectively retained in the housing. The housing has a mating cavity extending through a front face thereof, a receiving hole extending through a rear face thereof, and a projection rearwards projecting from the rear face. The central contact is of a uni-configuration and defines an engaging portion extending into the mating cavity, a retaining portion extending from the engaging portion and retained in the receiving hole and a connecting portion extending out of the housing from the retaining portion. The projection defines a retaining slot opened sideward and a supporting portion disposed between the retaining slot and the rear face of the housing, the connecting portion climbs over the supporting portion and runs through the retaining slot.

Other objects, advantages and novel features of the invention will become more apparent from the following detailed description of the present embodiment when taken in conjunction with the accompanying drawings.

DETAILED DESCRIPTION OF THE INVENTION

Figure 1:
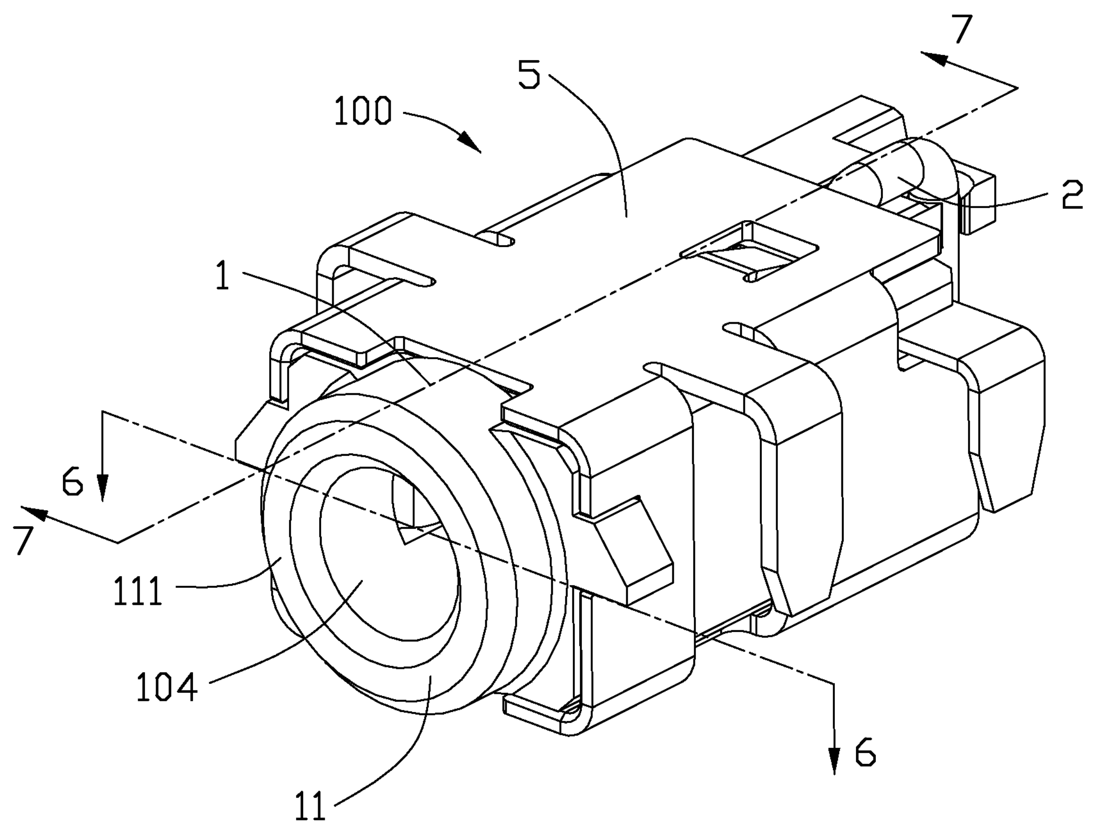
FIG. 1 is an assembled, perspective view of an electrical connector in accordance with the present invention.

Reference will now be made to the drawing figures to describe a preferred embodiment of the present invention in detail.

Figure 2:
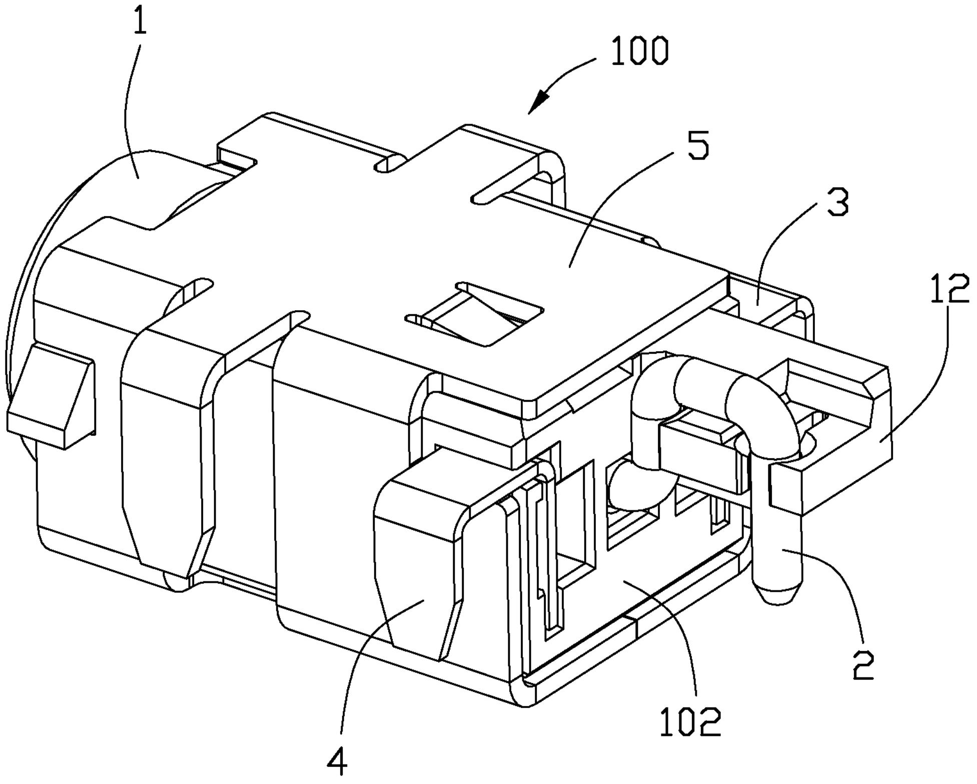
FIG. 2 is another perspective view of the electrical connector shown in FIG. 1.
Figure 3:
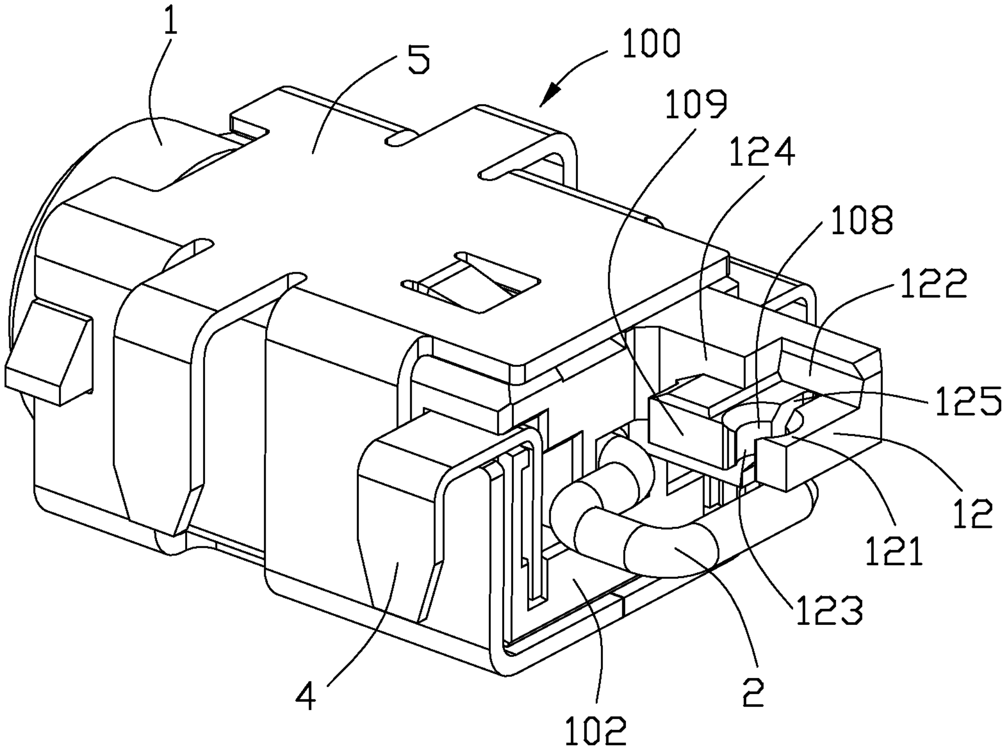
FIG. 3 is an assembled view of the electrical connector, which has a central contact before rotated to be retained therein.
Figure 4:
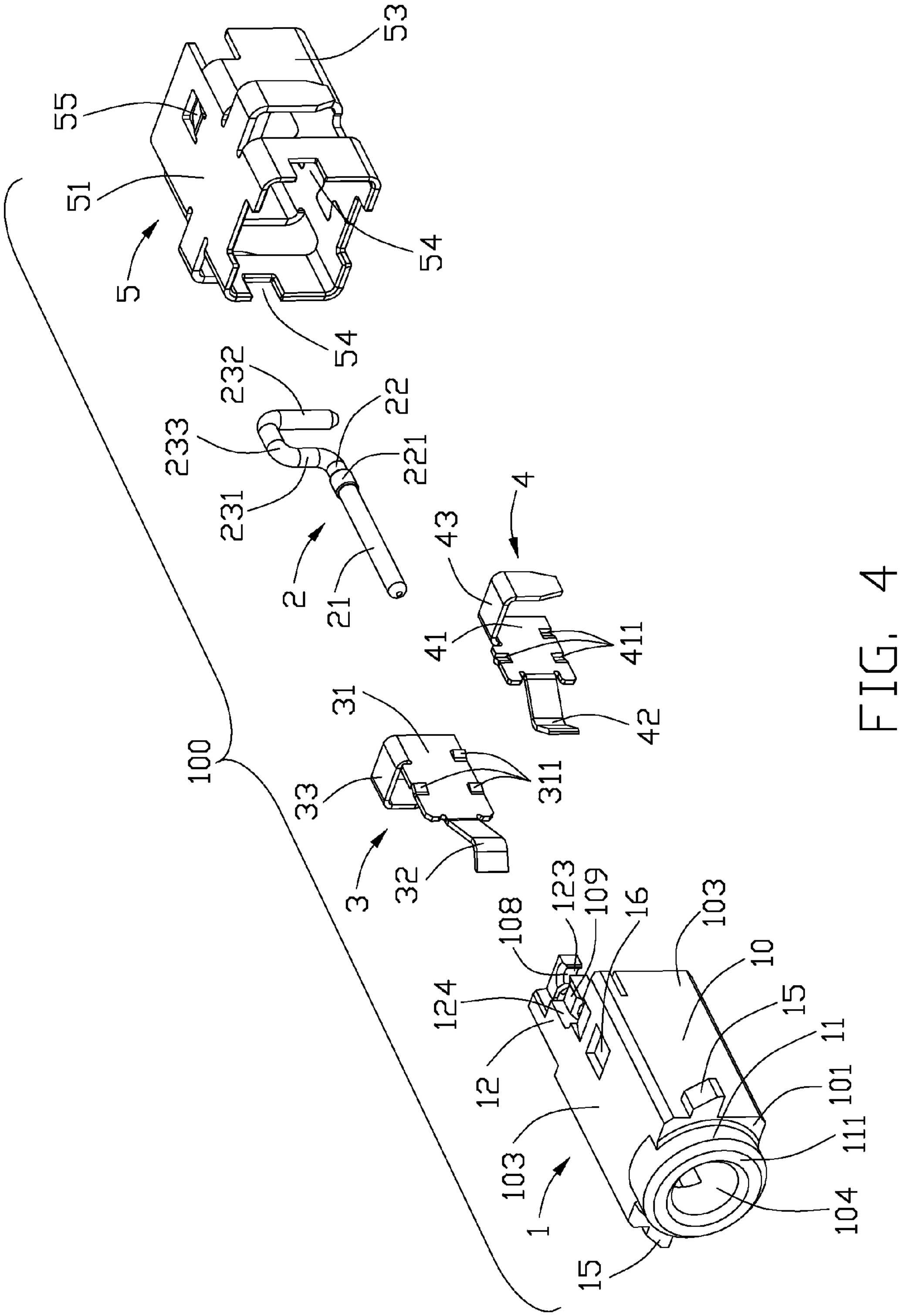
FIG. 4 is an exploded view of the electrical connector shown in FIG. 1.
Figure 5:
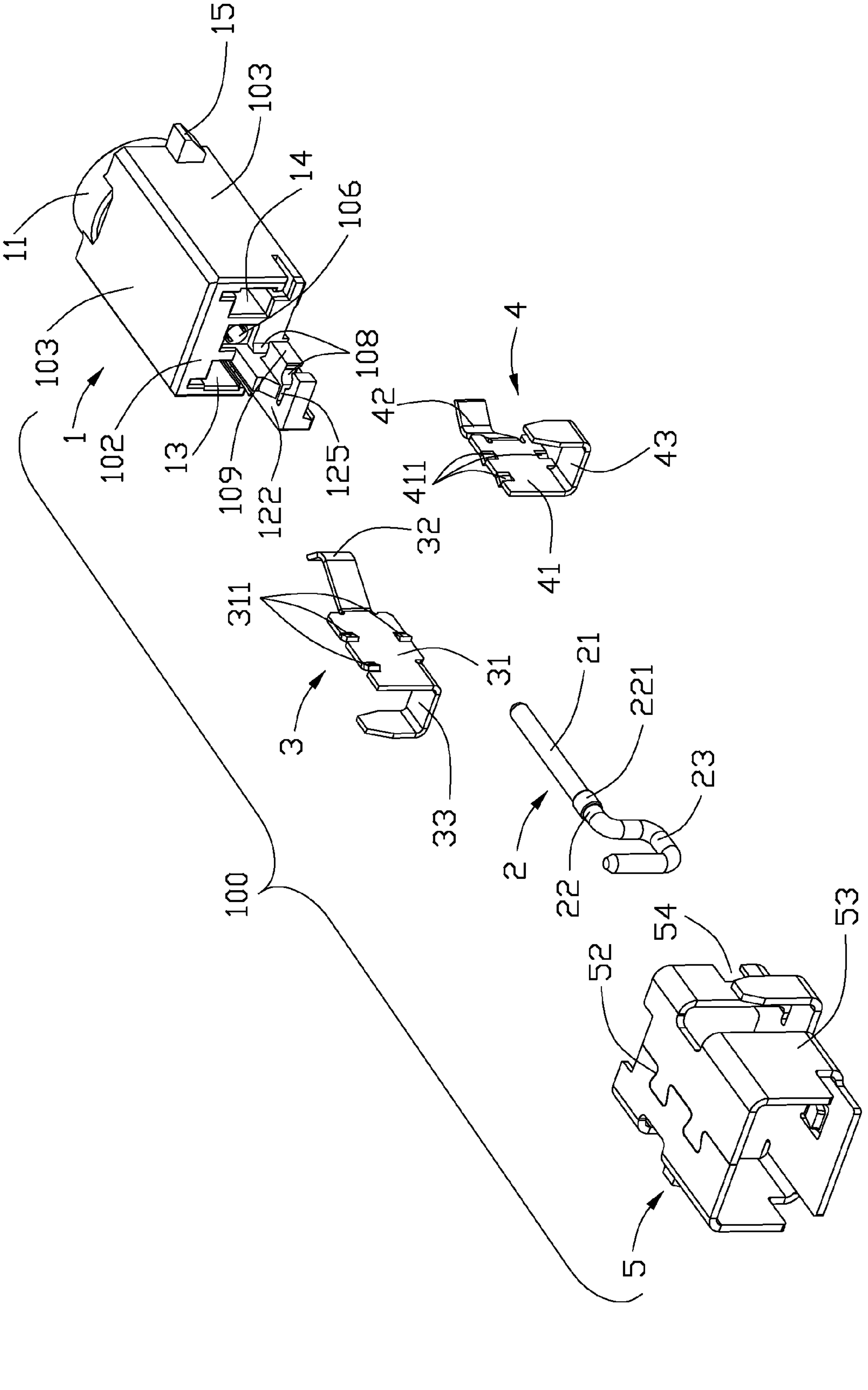
FIG. 5 is another exploded view of the electrical connector shown in FIG. 4.

Referring to FIGS. 1 to 5, disclosed here is an electrical connector 100 made in accordance with the present invention. The electrical connector 100 mainly includes an insulative housing 1, a plurality contacts received in the housing 1, and a metal shell 5 enclosing the housing 1.

Figure 6:
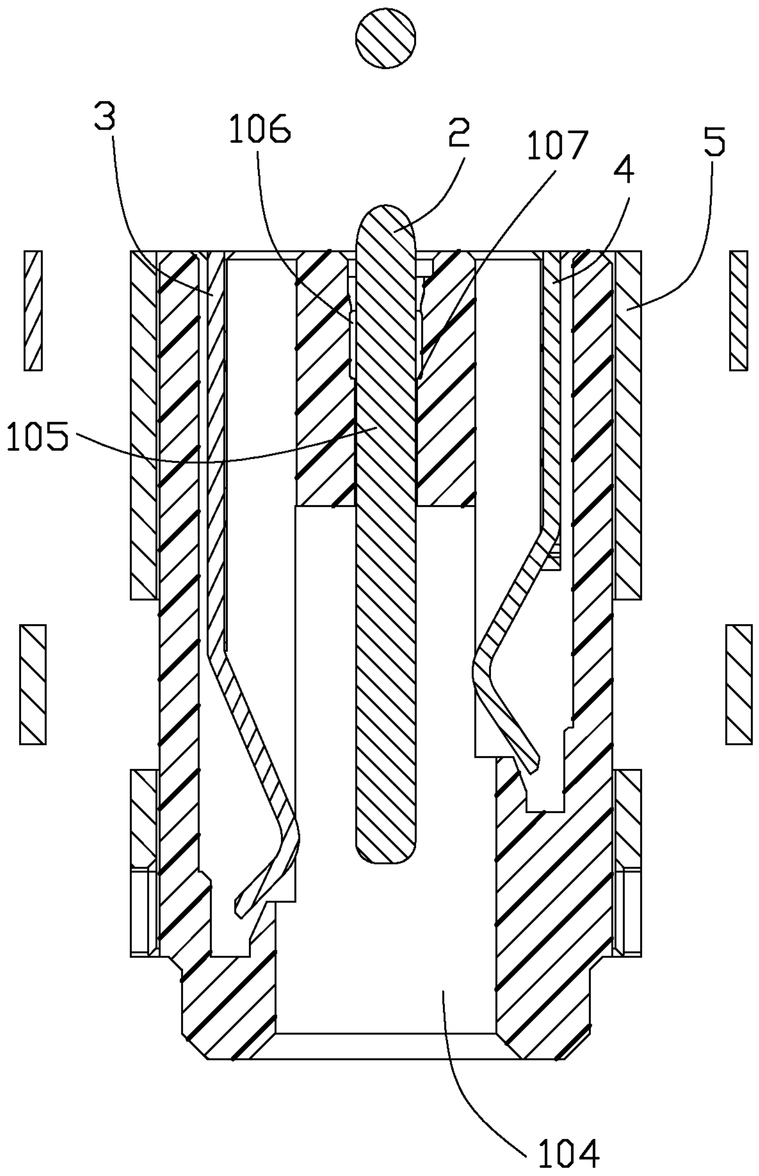
FIG. 6 is a cross-section view of the electrical connector taken along line 6-6 of FIG. 1.
Figure 7:
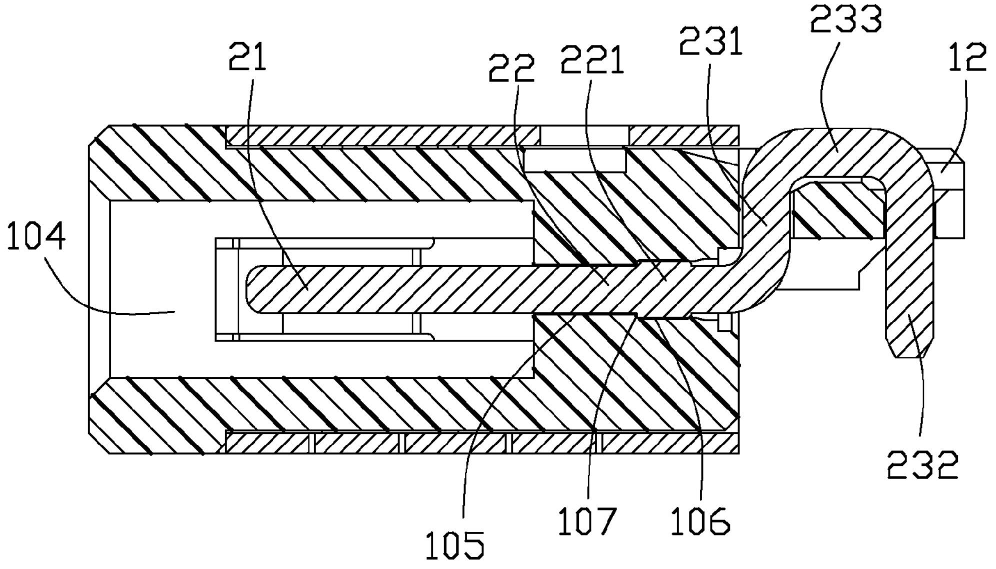
FIG. 7 is a cross-section view of the electrical connector taken along line 7-7 of FIG. 1.

Referring to FIGS. 3 to 7, the insulative housing 1 defines a rectangular main body portion 10 forming a front mating port thereof, a mating portion 11 forwardly extending from a front face 101 of the main body portion 10, and a projection 12 extending rearwards from a rear face 102 of the main body portion 10 forming a rear mounting port thereof. The mating portion 11 defines a mating face 111 and a mating cavity 104 recessed rearwards from the mating face 111, and the main body portion 10 defines a receiving hole (not labeled) recessed forwards from the rear face 102 and comprising a columnar front section 105 and a columnar rear section 106, and the front section 105 communicates with the mating cavity 104. A diameter of the front section 105 is larger than a diameter of the rear section 106, forming a step portion 107 therebetween. The main body portion 10 defines four sidewalls 103 connecting with the front face 101 and the rear face 102, a first receiving groove 13 and a second receiving groove 14 respectively disposes at two outer sides of the rear section 106 and extends forwards from the rear face 102 to communicate with the mating cavity 104. The main body portion 10 defines two protrusions 15 respectively projecting outwards from two opposite sidewalls 103, and a locking hole 16 is disposed in at least one of other two opposite sidewalls 103. The projection 12 defines a top face 121, a bottom face 122 opposite to the top face 121, and a retaining slot 108 running through the top face 121 and the bottom face 122. The retaining slot 108 opened sideward to provide a sideward opening 123 disposed between the top face 121 and the bottom face 122. The projection 12 provides a supporting portion 109 disposed between the retaining slot 108 and the rear face 102, and a blocking portion 124 rising upwards from the supporting portion 109 to be located opposite to the sideward opening 123. The projection 12 further defines a slot 125 disposed behind the blocking portion 124 to communicate with the retaining slot 108, which makes the projection 12 flexible along a mating direction.

Referring to FIGS. 4 to 7, the first contact 3 defines a first retaining portion 31, a first contacting portion 32 extending forwards from the first retaining portion 31, and a first soldering portion 33 bending sideward from an upper side edge of the first retaining portion 31. The first contact 3 is inserted into the housing 1 from the rear face 102 thereof, and the first retaining portion 31 is retained in the first receiving groove 13, the first contacting portion 32 projects into the mating cavity 104, and the first soldering portion 33 extends out of the housing 1. First elastic pieces 311 punched from upper and lower side edges of the first retaining portion 31 may readily enhance the engagement between the first retaining portion 31 and the housing 1.

The second contact 4 defines a second retaining portion 41, a second contacting portion 42 extending forwards from the second retaining portion 41, and a second soldering portion 43 bending sideward from an upper side edge of the second retaining portion 41. The second contact 4 is inserted into the housing 1 from the rear face 102 thereof, and the second retaining portion 41 is retained in the second receiving groove 14, the second contacting portion 42 projects into the mating cavity 104, and the second soldering portion 43 extends out of the housing 1. Second elastic pieces 411 punched from upper and lower side edges of the second retaining portion 41 may readily enhance the engagement between the second retaining portion 41 and the housing 1. The first contacting portion 32 is closer to the mating face 111 than the second contacting portion 42.

The central contact 2 is a one piece configuration and comprises an engaging portion 21 for engaging with a complementary connector (not shown), a retaining portion 22 and a U-shaped connecting portion 23 for connecting to print circuit board. The engaging portion 21, the retaining portion 22 and the connecting portion 23 are arranged in a line and all in the shape of columns, and the central contact 2 is revolvable relative to the housing 1. The retaining portion 22 provides a columnar engaging portion 221 with larger diameter than other portion of the retaining portion 22. The connecting portion 23 defines a first locking portion 231 extending upwards from a rear end of the retaining portion 22, a second locking portion 232 opposite to the first locking portion 231, and a horizontal portion 233 connecting the first locking portion 231 with the second locking portion 232.

Referring to FIGS. 2 to 7, the central contact 2 is firstly inserted into the housing 1 from the rear face 102 thereof, the engaging portion 21 protrudes into the mating cavity 104 throughout the receiving hole comprising the columnar front section 105 and the columnar rear section 106 while the retaining portion 22 received in the receiving hole, the connecting portion 23 protrudes out of the housing 1 and is disposed in a plane parallel to the top face 121 of the projection 12. The engaging portion 221 is received in the rear section 106 and blocked by the step portion 107, which can prevent the central contact 2 from overrunning. Then, the connecting portion 23 is pushed to rotate toward the projection 12 until the first locking portion 231 sandwiched between the rear face 102 and the supporting portion 109, and the second locking portion 232 throughout the sideward opening 123 to be retained in the retaining slot 108, the horizontal portion 233 climbs over the supporting portion 109 and is blocked by the blocking portion 124. The central contact 2 is driven to rotate in the receiving hole, and the connecting portion 23 is rotated to enter into the retaining slot 108 from the sideward opening 123, the connecting portion 23 is disposed in a plane perpendicularly to the top face 121 of the projection 12 when the central contact 2 is retained in the housing 1. The projection 12 which resiliently engages the second locking portion 232 can prevent the second locking portion 232 from running out of the sideward opening 123. The first locking portion 231 is sandwiched between the rear face 102 and the supporting portion 109 to restrict the connecting portion 23 in the mating direction. The blocking portion 124 blocks the horizontal portion 233 to prevent the central contact 2 from rotating unwontedly. The engaging portion 21, the retaining portion 22 and the connecting portion 23 of the central contact 2 are all in the shape of columns, which makes the configuration of the central contact 2 simple, and the central contact 2 which is rotated to be retained to the housing 1 can make the assemblage of the central contact 2 easily.

Referring to FIG. 2 to FIG. 5, the metal shell 5 defines a top piece 51, a bottom piece 52 opposite to the top piece 51 and two side pieces 53 connecting with the top piece 51 and the bottom piece 52. The metal shell 5 defines two soldering legs 56 extending downwardly from two opposite side edges of the top piece 51 and an abutting piece 55 formed at a rear portion of the top piece 51. Each side piece 53 defines a locking slot 54 at a front side edge thereof. The metal shell 5 is forwardly assembled to enclose the housing 1, the protrusions 15 disposed at two opposite sidewalls 103 of the housing 1 are received in the corresponding locking slots 54 and further block the side pieces 53 to prevent the metal shell 5 from forwardly moving overly. The abutting piece 55 is restricted in the locking hole 16 to prevent the metal shell 5 from moving retract inwardly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:

an insulative housing having a mating cavity extending through a front face thereof, a receiving hole extending through a rear face thereof, and a projection rearwards projecting from the rear face;

a first contact extending into the mating cavity; and a central contact being of a uni-configuration and comprising an engaging portion extending into the mating cavity, a retaining portion extending from the engaging portion and retained in the receiving hole and a connecting portion extending out of the housing from the retaining portion;

wherein the projection defines a retaining slot opened sideward and a supporting portion disposed between the retaining slot and the rear face of the housing, the connecting portion climbs over the supporting portion and runs through the retaining slot.

2. The electrical connector as described in claim 1, wherein the projection defines a top face and a bottom face opposite to the top face, the retaining slot runs through the top and bottom faces and provides a sideward opening disposed between the top and bottom faces.

3. The electrical connector as described in claim 2, wherein the connecting portion defines a first locking portion, a second locking portion opposite to the first locking portion, and a horizontal portion connecting the first locking portion with the second locking portion, the first locking portion is disposed between the rear face and the supporting portion, and the supporting portion is sandwich by the first locking portion and the second locking portion.

4. The electrical connector as described in claim 3, wherein the horizontal portion climbs over the supporting portion and the second locking portion is retained in the retaining slot by entering from the sideward opening.

5. The electrical connector as described in claim 4, wherein the projection is disposed above the receiving hole.

6. The electrical connector as described in claim 4, wherein the projection defines a slot communicating with the retaining slot.

7. The electrical connector as described in claim 6, wherein the projection defines a blocking portion rising upwards from the supporting portion, and the slot is disposed behind the blocking portion.

8. The electrical connector as described in claim 7, wherein the engaging portion, the retaining portion and the connecting portion are all in the shape of columns.

9. An electrical connector comprising:

an insulative housing having a mating cavity extending through a front face thereof, a receiving hole extending through a rear face thereof, and a projection rearwards projecting from the rear face, the projection defining a top face and a bottom face opposite to the top face;

a first contact extending into the mating cavity; and a central contact being a single piece and comprising an engaging portion extending into the mating cavity, a retaining portion extending from the engaging portion and retained in the receiving hole and a connecting portion extending out of the housing from the retaining portion;

wherein the projection defines a retaining slot running through the top and bottom faces and opened sideward to provide a sideward opening disposed between the top and bottom faces for permitting the connecting portion rotated therethrough to enter into the retaining slot.

10. The electrical connector as described in claim 9, wherein the projection defines a blocking portion located opposite to the sideward opening.

11. The electrical connector as described in claim 9, wherein the projection defines a slot communicating with the retaining slot.

12. The electrical connector as described in claim 11, wherein the engaging portion, the retaining portion and the connecting portion are all in the shape of columns.

13. The electrical connector as described in claim 12, wherein the connecting portion defines a first locking portion extending upwards from a rear end of the retaining portion, a second locking portion opposite to the first locking portion, and a horizontal portion connecting the first locking portion with the second locking portion, the second locking portion enters into the retaining slot from the sideward opening.

14. The electrical connector as claimed in claim 9, wherein said connecting portion defines a U-shaped configuration including a first locking portion extending from a rear end of the retaining portion, a second locking portion opposite to the first locking portion, and a horizontal portion connecting the first locking portion and the second locking potion, and wherein the second locking portion enters into the retaining slot from the sideward opening.

15. An electrical connector comprising:

an insulative housing defining a front mating port behind the front face, and a rear mounting port behind a rear face;

a projection formed on the rear mounting port; and a center contact being formed by an elongated round bar and defining a front engaging section forwardly extending into the front mating port, a rear connecting section angled with regard to the engaging section;

wherein the rear mounting port is configured to allow the front engaging section of the center contact to be forwardly inserted into the front mating port with the rear connecting section at a first angular position, and successively stopped at a position in an axial direction of the front engaging section under condition that the front engaging section cannot move forwardly or radially and the connecting section is exposed outside of the rear face, and finally to allow the rear connecting section to be rotated about an axis defined by the front engaging section of the contact from the first angular position to a second angular position to have the rear connecting engaged with the projection so as to lock the center contact both axially and angularly without movement with regard to the housing; wherein said projection defines a bottom face, for confronting a printed circuit board, through which the rear connecting section extends for mounting to the printed circuit board; wherein said bottom face is located around a mid-level of the connector.

16. The electrical connector as claimed in claim 15, wherein the rear connecting section defines a tail for connecting to a printed circuit board.

17. The electrical connector as claimed in claim 15, wherein the projection defines a recess communicating with an exterior vertically and sidewardly at specific radial position so as to allow a portion of the rear connecting section to be received therein sidewardly for locking and also extending vertically for mounting to said printed circuit board.

18. The electrical connector as claimed in claim 15, further including a periphery contact defines a right angle tail which a horizontal section of said right angle tail is higher than the bottom face.

19. The electrical connector as claimed 15, wherein said rear connecting section defines a U-shaped configuration.

20. The electrical connector as claimed in claim 15, wherein in the second angular position, the rear connecting section climbs over the projection.

* * * * *